(12) United States Patent
Yamamoto et al.

(10) Patent No.: US 10,756,165 B2
(45) Date of Patent: Aug. 25, 2020

(54) HIGH-FREQUENCY TRANSISTOR

(71) Applicant: PANASONIC INTELLECTUAL PROPERTY MANAGEMENT CO., LTD., Osaka (JP)

(72) Inventors: Kouki Yamamoto, Shiga (JP); Masatoshi Kamitani, Osaka (JP); Shingo Matsuda, Kyoto (JP); Hiroshi Sugiyama, Osaka (JP); Kaname Motoyoshi, Hyogo (JP); Masao Nakayama, Shiga (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/549,290

(22) Filed: Aug. 23, 2019

(65) Prior Publication Data

US 2019/0378894 A1    Dec. 12, 2019

Related U.S. Application Data

(63) Continuation of application No. PCT/JP2018/006854, filed on Feb. 26, 2018.

(30) Foreign Application Priority Data

Feb. 27, 2017    (JP) .................................. 2017-035413

(51) Int. Cl.
*H01L 29/06* (2006.01)
*H01L 21/50* (2006.01)
(Continued)

(52) U.S. Cl.
CPC .............. *H01L 29/06* (2013.01); *H01L 21/50* (2013.01); *H01L 23/66* (2013.01);
(Continued)

(58) Field of Classification Search
CPC ...... H01L 21/50; H01L 23/4824; H01L 23/66; H01L 29/06; H01L 29/402;
(Continued)

(56) References Cited

U.S. PATENT DOCUMENTS 4,065,782 A    12/1977    Gray et al.
9,035,469 B2 *    5/2015    Takagi ................... H01L 24/42
                                                               257/784

(Continued)

FOREIGN PATENT DOCUMENTS

JP    S60-032987 B2    7/1985
JP    S63-309001 A    12/1988
(Continued)

OTHER PUBLICATIONS

International Search Report dated May 1, 2018 in International Application No. PCT/JP2018/006854, with English translation.

(Continued)

*Primary Examiner* — Allan R Wilson
(74) *Attorney, Agent, or Firm* — McDermott Will & Emery LLP

(57) ABSTRACT

A high-frequency transistor includes a source electrode, a drain electrode, a gate electrode, and a gate drive line that applies a voltage to the gate electrode. An impedance adjustment circuit is connected between the gate electrode and the gate drive line. A characteristic impedance of the gate electrode is Z1, when a connecting point between the impedance adjustment circuit and the gate electrode is viewed from the impedance adjustment circuit. A characteristic impedance of the gate drive line is Z2, when a connecting point between the impedance adjustment circuit and the gate drive line is viewed from the impedance adjustment circuit. X that denotes a characteristic impedance of the impedance adjustment circuit is a value between Z1 and Z2.

11 Claims, 15 Drawing Sheets

(51) Int. Cl.
*H01L 23/66* (2006.01)
*H01L 29/423* (2006.01)
*H01L 29/812* (2006.01)

(52) U.S. Cl.
CPC .... *H01L 29/42316* (2013.01); *H01L 29/8124* (2013.01); *H01L 29/8126* (2013.01)

(58) Field of Classification Search
CPC .......... H01L 29/4175; H01L 29/42316; H01L 29/8124; H01L 29/8126
See application file for complete search history.

(56) References Cited

U.S. PATENT DOCUMENTS

| | | | | |
|---|---|---|---|---|
| 2003/0085428 | A1* | 5/2003 | Nelson | H01L 29/0692 |
| | | | | 257/368 |
| 2017/0077276 | A1* | 3/2017 | Suzuki | H01L 23/64 |

FOREIGN PATENT DOCUMENTS

| | | |
|---|---|---|
| JP | H05-102777 A | 4/1993 |
| JP | 2739851 B2 | 4/1998 |
| JP | 2001-274415 A | 10/2001 |
| JP | 2006-041232 A | 2/2006 |

OTHER PUBLICATIONS

Written Opinion of the International Searching Authority, dated May 1, 2018 in International Application No. PCT/JP2018/006854, with English translation.

* cited by examiner

HIGH-FREQUENCY TRANSISTOR

CROSS REFERENCE TO RELATED APPLICATIONS

This application is a U.S. continuation application of PCT International Patent Application Number PCT/JP2018/006854 filed on Feb. 26, 2018, claiming the benefit of priority of Japanese Patent Application Number 2017-035413 filed on Feb. 27, 2017, the entire contents of which are hereby incorporated by reference.

BACKGROUND

1. Technical Field

The present disclosure relates to a high-frequency transistor, and particularly to a high-frequency field-effect transistor (FET).

2. Description of the Related Art

FIG. 1 is a plan view of a FET described in Japanese Patent No. 1305975.

As shown in FIG. 1, the FET of Japanese Patent No. 1305975 includes operating part 807o of a gate, drain electrode 806, source electrode 805, supplying part 807s of the gate, and cross-connectors 807c.

As a FET, operating part 807o of the gate is interposed between drain electrode 806 and source electrode 805. Supplying part 807s of the gate is disposed in parallel to source electrode 805. Operating part 807o and supplying part 807s of the gate sandwich source electrode 805. In addition, operating part 807o is connected to supplying part 807s in a plurality of positions by the plurality of cross-connectors 807c.

In Japanese Patent No. 1305975, supplying part 807s of the gate is a line with a restive component as low as drain electrode 806. The connection of this supplying part 807s to operating part 807o in the plurality of positions reduces an increase in the restive component, which may occur if more operating parts 807o are provided longitudinally in an elongate stripline structure. This connection also aims to reduce an increase in the phase difference between operating part 807o of the gate and drain electrode 806, and to increase the total width of the gate using operating parts 807o.

FIG. 2 is a plan view illustrating (a) a microwave transistor and (b) the structure of a gate, respectively, which are described in Japanese Patent No. 2739851.

As shown in (a) and (b) of FIG. 2, this FET as a microwave transistor includes: gate fingers 905; gate bus lines 904; gate input point 908, gate bypass line 907, sources 902, and drain output point 909.

As a FET, gate fingers 905 interposed between the fingers of drain 901 and the fingers of sources 902. Gate fingers 905 extend like a comb from each of gate bus lines 904. These gate bus lines 904 are formed in two stages to provide two groups of gate fingers 905 longitudinally. In addition, the lengths of gate fingers 905 decrease with an increase in the distance from the center of each gate bus line 904 to gate fingers 905 connected to the gate bus line.

In Japanese Patent No. 2739851, the two stages of gate bus lines 904 halve the transverse expansion, which may occur in a single stage configuration. In addition, Japanese Patent No. 2739851 aims to eliminate the phase differences among the tips of gate fingers 905 by adjusting the lengths of gate fingers 905 in accordance with the distances from the center of each gate bus line 904 to gate fingers 905.

SUMMARY

However, the FET according to each of Japanese Patent No. 1305975 and Japanese Patent No. 2739851 has the problem of a large mismatch loss at the gate input. There is also a problem that a phase difference tends to occur between the gate and the drain.

It is an objective of the present disclosure to provide a high-frequency transistor with the following advantages, even if the number of fingers is increased longitudinally to increase the total width of a gate. The transistor reduces mismatch loss to be generated when a signal is input to the gate, and the phase difference between a gate and a drain, to achieve high gain performance and high efficiency characteristics.

In order to achieve the objective, a high-frequency transistor according to an aspect of the present disclosure includes: a semiconductor substrate; a source electrode on the semiconductor substrate; a drain electrode on the semiconductor substrate; a gate electrode on the semiconductor substrate; a gate drive line for applying a voltage to the gate electrode; and an impedance adjustment circuit connected between the gate electrode and the gate drive line. X that denotes a characteristic impedance of the impedance adjustment circuit is a value between Z1 and Z2, where a characteristic impedance of the gate electrode is Z1, when a connecting point between the impedance adjustment circuit and the gate electrode is viewed from the impedance adjustment circuit, and a characteristic impedance of the gate drive line is Z2, when a connecting point between the impedance adjustment circuit and the gate drive line is viewed from the impedance adjustment circuit.

The high-frequency transistor according to the present disclosure provides the following advantages, even if the number of fingers is increased longitudinally to increase the total width of the gate. The transistor reduces the mismatch loss to be generated when a signal is input to the gate, and the phase difference between the gate and the drain, to achieve high gain performance and high efficiency characteristics.

BRIEF DESCRIPTION OF DRAWINGS

These and other objects, advantages and features of the disclosure will become apparent from the following description thereof taken in conjunction with the accompanying drawings that illustrate specific embodiments of the present disclosure.

DETAILED DESCRIPTION OF THE EMBODIMENTS

Founding as Basis of Present Disclosure

The present inventors found that the following problems occur in the FETs, particularly in the high-frequency transistors cited above as the background art.

Figure 1:
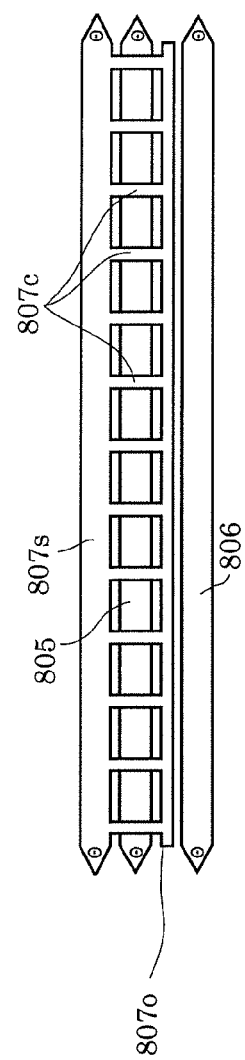
FIG. 1 illustrates a configuration of a FET described in Japanese Patent No. 1305975.

In the configuration of Japanese Patent No. 1305975 shown in FIG. 1, a voltage supplied to the gate is supplied from supplying part 807s via cross-connectors 807c to operating part 807o. These supplying part 807s, cross-connectors 807c, and operating part 807o may be regarded as a distribution constant line made of metal. The distribution constant line has characteristic impedance Zo represented by the ratio of the voltage to the current of an alternating-current signal proceeding on the line. Without any loss, the line has characteristic impedance Zo represented by Equation (1).

$$Zo = \sqrt{\frac{L}{C}} \quad (1)$$

L and C here represent a series inductance component and a parallel capacitive component, respectively, per unit length of the distribution constant line.

L and C per unit length are determined by the width (W) of the line, the thickness (H) of a dielectric body between the line and a conductor coupled to the line through the electric field, and the effective dielectric constant (εre) of this dielectric body. For example, characteristic impedance Zo of a microstripline structure is represented by Equation (2), where W/H<1, and by Equation (3), where W/H>1.

$$Zo = \frac{60}{\sqrt{\varepsilon re}} \ln\left(\frac{8H}{W} + 0.25\frac{W}{H}\right) \quad (2)$$

$$Zo = \frac{120\pi}{\sqrt{\varepsilon re}} \left\{\frac{W}{H} + 1.393 + 0.667\ln\left(\frac{W}{H} + 1.444\right)\right\}^{-1} \quad (3)$$

Operating part 807o of the gate shown in FIG. 1 is a significantly elongate line to provide gate effects, and usually has a width of about 1 μm or smaller at a FET with a microwave band. The conductor coupled, as a microstripline structure, to this operating part 807o through the electric field does not exist near operating part 807o in the vertical direction. The conductor is usually placed as a conductive film below the back surface of a semiconductor substrate mounted with the FET at a distance within a range from 100 μm to 200 μm from operating part 807o. This structure has a significantly low capacitive component between the line and the conductor. Operating part 807o of FIG. 1 has a characteristic impedance over 150Ω, according to Equation (2).

Since supplying part 807s of the gate shown in FIG. 1 has the substantially same configuration as drain electrode 806, the line has a width not causing any significant resistance loss, that is about 15 μm. There is no conductor near supplying part 807s in the vertical direction. Thus, like operating part 807o, supplying part 807s may be coupled to the conductive film formed on the back surface of the semiconductor substrate, which is mounted with the FET, through the electric field. Therefore, supplying part 807s of FIG. 1 has a characteristic impedance over 90Ω, according to Equation (2).

Cross-connectors 807c of the gate shown in FIG. 1 have substantially the same line widths as supplying part 807s, and connect supplying part 807s and operating part 807o together over source electrode 805. A dielectric film with a thickness of about 1 µm exists between cross-connectors 807c of the gate and source electrode 805. Therefore, cross-connectors 807c of FIG. 1 have characteristic impedances lower than or equal to 12Ω, according to Equation (3).

In the configuration of Japanese Patent No. 1305975 shown in FIG. 1, cross-connectors 807c of gate connect operating part 807o and supplying part 807s together at T-junctions in intermediate positions of the lines. As viewed from cross-connectors 807c, the T-junctions have characteristic impedances that are halves of those of the respective lines. Therefore, the T-junctions of operating part 807o have characteristic impedances of 75Ω or higher, the T-junctions of supplying part 807s have characteristic impedances of 45Ω or higher, and cross-connectors 807c have characteristic impedances of 12Ω or lower.

In connecting points between these elements with different characteristic impedances, the reflection coefficients increase at the connecting points with an increase in the differences between the characteristic impedances. A large amount of proceeding signals is reflected on the connecting surfaces to increase the loss. For example, at one of cross-connectors 807c of the gate shown in FIG. 1, the mismatch losses at the connecting points between this cross-connector 807c and operating part 807o and between this cross-connector 807c and supplying part 807s can be calculated from Equation (5).

In Equation (4) and Equation (5), different characteristic impedances are Z1 and Z2, the reflection coefficient at the connecting point between elements with Z1 and Z2 is Γ, and the mismatch loss at the connecting point is M [dB].

$$\Gamma = \frac{Z1 - Z2}{Z1 + Z2} \quad (4)$$

$$M = -10\log(1 - |\Gamma|^2) \quad (5)$$

According to Equation (5), the mismatch loss between operating part 807o and cross-connector 807c of the gate is 3.23 [dB], whereas the mismatch loss between supplying part 807s and cross-connectors 807c of the gate is 1.77 [dB]. In total, there is the mismatch loss of 5.0 [dB]. This mismatch loss occurs at all frequency bands and thus causes loss of a fundamental-frequency input signal at the FET to degrade the gain performance. Accordingly, second harmonic control does not effectively function at the input.

The configuration of FIG. 1 is largely advantageous in reducing the phase difference between operating part 807o of the gate and drain electrode 806, but does not completely eliminate the phase difference. At the connecting points between operating part 807o and cross-connectors 807c, the phase differences exist from the starting point of operating part 807o to the connecting points. Every time when another operating part 807o is longitudinally stacked above operating part 807o, the phase differences accumulate. This increases the phase difference between operating part 807o of the gate and drain electrode 806, not allowing for an improvement in the efficiency characteristics of the FET.

Japanese Patent No. 2739851 also has the problem of mismatch loss between characteristic impedances like Japanese Patent No. 1305975.

Figure 2:
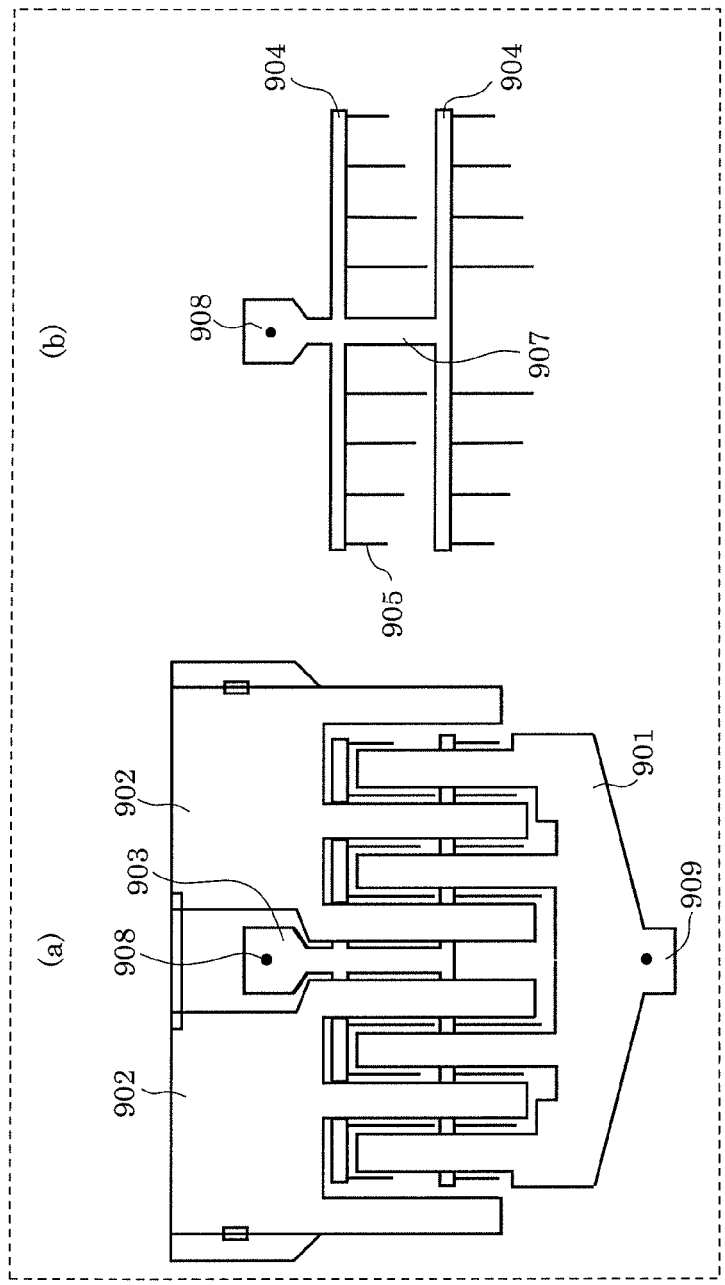
FIG. 2 is a plan view illustrating (a) a microwave transistor and (b) the structure of a gate, respectively, which are described in Japanese Patent No. 2739851.

In the configuration of Japanese Patent No. 2739851 shown in (a) and (b) of FIG. 2, gate fingers 905 has a characteristic impedance of about 150Ω like the configuration of Japanese Patent No. 1305975. Bypass line 907, which penetrates the centers of the gate drive lines from a gate electrode pad, has an impedance of about 85Ω. The one of gate bus lines 904, which is closer to a source electrode pad, overlaps the source fingers and has a characteristic impedance of about 12Ω as in Japanese Patent No. 1305975. Since gate bus lines 904 are connected to gate fingers 905 and the ending points of bypass line 907, the characteristic impedances of gate fingers 905 and bypass line 907 as viewed from gate bus lines 904 are equal to the characteristic impedances of the respective lines of gate fingers 905 and bypass line 907. According to Equation (5), the mismatch loss between gate fingers 905 and gate bus lines 904 is 5.6 [dB], whereas the mismatch loss between gate bus lines 904 and bypass line 907 is 3.6 [dB]. In total, there is the mismatch loss as large as 9.2 [dB]. From the forgoing, Japanese Patent No. 2739851 also has the problem of mismatch loss like Japanese Patent No. 1305975.

In the configuration of (a) and (b) of FIG. 2, the ones of gate fingers 905 located in the ending points of gate bus lines 904 have shorter lengths to adjust the phases. In this method, however, the ones of gate fingers 905 with the shorter lengths reduce, as non-drive areas, the area utilization.

In addition, gate bus lines 904 at the respective stages in the configuration of (a) and (b) of FIG. 2 over the fingers constituting source 902 differently from each other. With an increase in the amount of phase rotation of gate bus lines 904, which mesh with the fingers constituting source 902; the phase difference occurs between the first and second stages. This phase difference leads to the phase differences among the fingers constituting the same drain 901, thereby causing the problem of hindering an improvement in the efficiency characteristics of the FET.

As described above, the objective of the present disclosure is to provide a high-frequency transistor with the following advantages, even if the number of fingers is increased longitudinally to increase the total width of a gate. The transistor reduces mismatch loss when a signal is input from a line to the gate, and the phase difference between the gate and a drain, to achieve high gain performance and high efficiency characteristics.

In order to achieve the objective, a high-frequency transistor according to an objective of the present disclosure includes: a semiconductor substrate; a source electrode on the semiconductor substrate; a drain electrode on the semiconductor substrate; a gate electrode on the semiconductor substrate; a gate drive line for applying a voltage to the gate electrode; and an impedance adjustment circuit connected between the gate electrode and the gate drive line. X that denotes a characteristic impedance of the impedance adjustment circuit is a value between Z1 and Z2, where a characteristic impedance of the gate electrode is Z1, when a connecting point between the impedance adjustment circuit and the gate electrode is viewed from the impedance adjustment circuit, and a characteristic impedance of the gate drive line is Z2, when a connecting point between the impedance adjustment circuit and the gate drive line is viewed from the impedance adjustment circuit.

This configuration reduces the mismatch loss at the input of a signal to the gate electrode and the phase difference between the gate electrode and the drain electrode to achieve high gain performance and high efficiency characteristics.

Now, embodiments of the present disclosure will be described below in detail.

Note that the embodiments described below are mere comprehensive or specific examples. The numerical values, shapes, materials, constituent elements, the arrangement and connection of the constituent elements etc. shown in the following embodiments are thus examples, and are not intended to limit the scope of the present disclosure. Among the constituent elements in the following embodiments, those not recited in the independent claim defining the broadest concept of the present disclosure are described as optional constituent elements.

Embodiment 1

Figure 3:
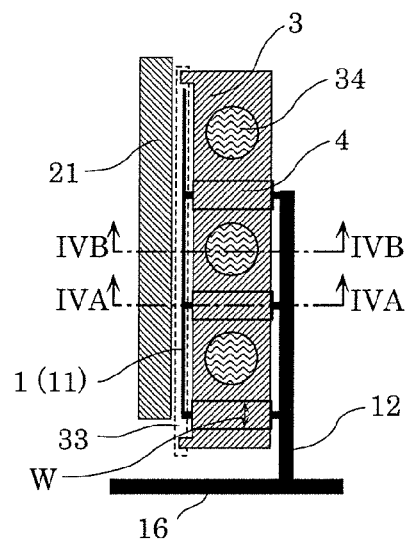
FIG. 3 is a schematic plan view illustrating a configuration example of a high-frequency transistor according to Embodiment 1.
Figure 4A:
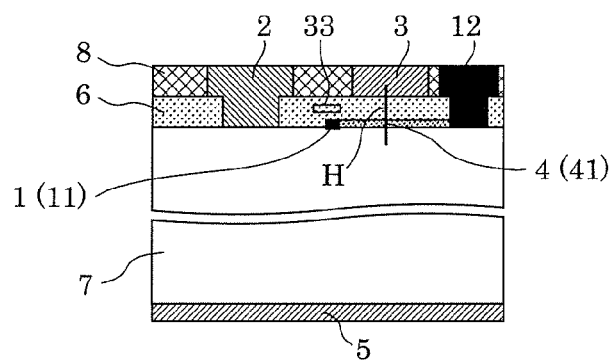
FIG. 4A is a cross-sectional view of the high-frequency transistor according to Embodiment 1 taken along line IVA-IVA.
Figure 4B:
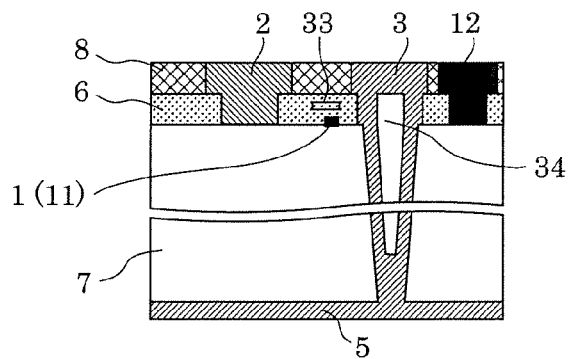
FIG. 4B is a cross-sectional view of the high-frequency transistor according to Embodiment 1 taken along line IVB-IVB.

FIG. 3 is a schematic plan view of a high-frequency transistor according to Embodiment 1. FIG. 4A is a cross-sectional view taken along line IVA-IVA of FIG. 3. FIG. 4B is a cross-sectional view of taken along line IVB-IVB of FIG. 3. In FIG. 3, the transistor is a single high-frequency transistor, but may be a part of a multi-finger high-frequency transistor (see, e.g., FIGS. 21 and 22). As shown in FIGS. 3, 4A, and 4B, this high-frequency transistor is a FET including gate electrode 1, gate drive line 12, drain electrode 2, source electrode 3, source field plate 33, impedance adjustment circuits 4, ground conductive film 5, dielectric film 6, semiconductor substrate 7, and protective film 8.

Gate electrode 1 is formed on semiconductor substrate 7, and includes one or more gate finger(s) 11.

Gate drive line 12 applies a voltage to gate electrode 1 via impedance adjustment circuits 4.

Drain electrode 2 is formed on semiconductor substrate 7, and includes drain finger 21 and a drain electrode pad.

Source electrode 3 is formed on semiconductor substrate 7, and includes source finger 31, source electrode pad 32, and source field plate 33.

Source field plate 33 is electrically connected to source electrode 3, and covers gate finger 11.

Impedance adjustment circuits 4 are connected between gate electrode 1 (here, gate finger 11) and gate drive line 12. The circuits are provided to reduce the loss caused by impedance mismatch between gate finger 11 and gate drive line 12, and to reduce the phase difference between gate electrode 1 and drain electrode 2. For this purpose, characteristic impedance X of each impedance adjustment circuit 4 is set to a value between Z1 and Z2. Z1 represents here the characteristic impedance of gate electrode 1, when the connecting point between impedance adjustment circuit 4 and gate electrode 1 is viewed from impedance adjustment circuit 4. Z2 represents the characteristic impedance of gate drive line 12, when the connecting point between impedance adjustment circuit 4 and gate drive line 12 is viewed from impedance adjustment circuit 4. This configuration reduces more mismatch loss than in the case where gate finger 11 is directly connected to gate drive line 12, without any impedance adjustment circuit 4 interposed therebetween. This facilitates reduction in the phase difference between gate electrode 1 and drain electrode 2.

Impedance adjustment circuit 4 has a stripline structure including stripline 41. Specifically, stripline 41 is interposed between vertically provided ground planes (i.e., a source potential layer and ground conductive film 5 in FIGS. 4A and 4B). The stripline forms a transmission line that is coupled to these ground planes through the electric field. The source potential layer is here a collective term of constituent elements including source electrode 3 as well as source field plate 33 and the source finger, which have the same potential as source electrode 3. Source electrode 3 (i.e., the source potential layer) is connected to ground conductive film 5 via via hole 34, and has a ground potential.

Ground conductive film 5 is a ground layer with the ground potential, and connected to source electrode 3 via via holes 34.

Semiconductor substrate 7 includes a semiconductor layer and an epitaxial layer.

Gate electrode 1 according to Embodiment 1 is covered by source field plate 33, which is electrically connected to source electrode 3. Source electrode 3 is electrically connected to ground conductive film 5, which is formed on the back surface of semiconductor substrate 7, via via holes 34. That is, gate electrode 1 has a stripline structure. Note that source field plate 33 does not have to completely cover gate electrode 1, and may be close to gate electrode 1 to induce strong effects of electric field coupling.

The high-frequency transistor shown in FIG. 3 includes the plurality of impedance adjustment circuits 4. Gate electrode 1 is connected to gate drive line 12 in a plurality of positions via respective impedance adjustment circuits 4. Specifically, three connecting points on gate finger 11, which include the starting point and two T-junctions, are connected to three connecting points on gate drive line 12, which include two T-junctions and the ending point, via three impedance adjustment circuits 4, respectively. The starting point of gate finger 11 is here the one of the two ends of gate finger 11, which is closer to gate bus line 16. The ending point of gate drive line 12 is the one of the two ends of gate drive line 12, which is farther from gate bus line 16.

Drain finger 21 shown in FIG. 3 does not overlap gate electrode 1 or source electrode 3 not to add unnecessary output capacitance, thereby reducing degradation in the characteristics of the high-frequency transistor. As shown in FIGS. 4A and 4B, drain finger 21 has no stripline structure but a microstripline structure. The microstripline structure includes, as the lower ground plane, ground conductive film 5 on the back surface of semiconductor substrate 7, and no upper ground plane. Thus, drain finger 21 has a characteristic impedance higher than the value represented by Equation (2). Since a low capacitance is added, the amount of phase rotation decreases from the starting point to the ending point of drain finger 21.

While gate electrode 1 shown in FIG. 3 is significantly thin so that the FET exhibits gate effects, this configuration adds a significantly higher capacitance under the influence of source field plate 33. Thus, gate electrode 1 has characteristic impedance Z1 significantly lower than the values represented by Equations (2) and (3). Under a similar influence, the amount of phase rotation also increases significantly.

Gate drive line 12 shown in FIG. 3 is configured as a microstripline like drain electrode 2 to reduce the voltage drop or the phase rotation of the signal to be applied to gate electrode 1. Thus, characteristic impedance Z2 of gate drive line 12 has a high value like drain electrode 2 and causes a smaller amount of phase rotation.

Now, the principle of reducing the mismatch loss by connecting the lines with these different characteristic impedances Z1 and Z2 via impedance adjustment circuits 4 will be described.

For example, assume that gate finger 11 has a characteristic impedance of 10Ω, whereas gate drive line 12 has a characteristic impedance of 85Ω. The ending point of gate drive line 12 shown in FIG. 3 is connected to one of the T-junctions of gate finger 11. In this case, characteristic impedance Z1 at the T-junction of gate finger 11 viewed from gate drive line 12 is 5Ω, which is the half of the characteristic impedance of the gate finger. Characteristic impedance Z2 of the ending point at gate drive line 12 viewed from the T-junction of gate finger 11 agree with the characteristic impedance 85Ω of gate drive line 12. Direct connection at this connecting point between the junctions with characteristic impedance Z2 of 85Ω and the characteristic impedance of 5Ω causes mismatch loss of 6.8 dB.

Figure 5:
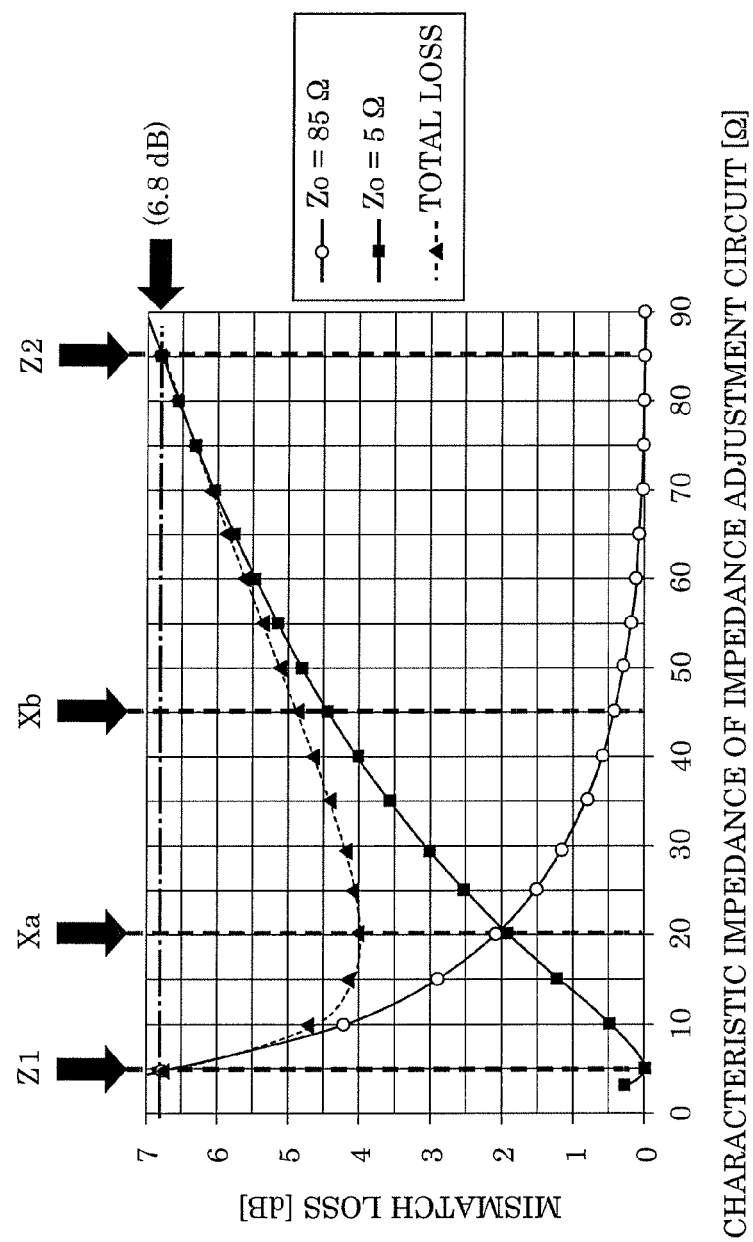
FIG. 5 is a graph for setting the magnitude of mismatch loss with respect to characteristic impedance X of an impedance adjustment circuit according to Embodiment 1.

FIG. 5 is a graph for setting the magnitude of the mismatch loss with respect to characteristic impedance X of each impedance adjustment circuit 4 according to Embodiment 1.

In this figure, Z1 represents the characteristic impedance of gate finger 11 at the connecting point (hereinafter referred to as a "first connecting point") between impedance adjustment circuit 4 and gate electrode 1 (i.e., gate finger 11), when the first connecting point is viewed from impedance adjustment circuit 4. Z1 is here 5Ω, like the T-junction described above.

Z2 represents the characteristic impedance of gate drive line 12 at the connecting point (hereinafter referred to as a "second connecting point") between impedance adjustment circuit 4 and gate drive line 12, when the second connecting point is viewed from impedance adjustment circuit 4. Z2 is 85Ω.

The curve with white circles represents the mismatch loss calculated from Equation (5), where impedance adjustment circuit 4 has the same characteristic impedance Zo=85Ω as characteristic impedance Z2. Specifically, at the first connecting point, the T-junction of gate finger 11 with characteristic impedance Z1 (=5Ω) is connected to impedance adjustment circuit 4 with characteristic impedance Zo (=85Ω). As a result, the impedance mismatch causes the mismatch loss of 6.8 dB at the first connecting point. At the second connecting point, impedance adjustment circuit 4 with characteristic impedance Zo (=85Ω) is connected to the ending point of gate drive line 12 with characteristic impedance Z2 (=85Ω). As a result, since the impedances match at the second connecting point, no mismatch loss (the mismatch loss of 0 dB) occurs.

The curve with black squares represents the mismatch loss calculated from Equation (5), where impedance adjustment circuit 4 has the same characteristic impedance Zo=5Ω as characteristic impedance Z1. Specifically, at the first connecting point, the T-junction of gate finger 11 with characteristic impedance Z1 (=5Ω) is connected to impedance adjustment circuit 4 with characteristic impedance Zo (=5Ω). As a result, since the impedances match at the first connecting point, no mismatch loss (the mismatch loss of 0 dB) occurs. At the second connecting point, impedance adjustment circuit 4 with characteristic impedance Zo (=5Ω) is connected to the ending point of gate drive line 12 with characteristic impedance Z2 (=85Ω). As a result, the impedance mismatch causes the mismatch loss of 6.8 dB at the second connecting point.

The curve with black triangles represents the total loss, which is the sum of the loss indicated by the curves with the white circles and black squares. The curve represents the mismatch loss, where impedance adjustment circuit 4 has characteristic impedance X indicated in the horizontal axis.

Xa represents the minimum of the mismatch loss indicated by the curve with the black triangles.

As indicated by the total mismatch loss (see the curve with the black triangles) of FIG. 5, the following is found where characteristic impedance X of impedance adjustment circuit 4 falls within the range (5Ω≤X≤85Ω), which are the characteristic impedances of the elements connected to the circuit. The sum of the mismatch loss between the impedance of impedance adjustment circuit 4 and characteristic impedance 85Ω, and between the impedance of impedance adjustment circuit 4 and characteristic impedance 5Ω is smaller than the mismatch loss of 6.8 dB, where the elements with characteristic impedances 85Ω and 5Ω are directly connected together.

In this manner, assume that gate finger 1 and gate drive line 12 have characteristic impedances Z1 and Z2, respectively, at the connecting points viewed from impedance adjustment circuit 4. At this time, characteristic impedance X of impedance adjustment circuit 4 is adjusted to a value between Z1 and Z2. This configuration reduces more mismatch loss than in the case where the elements with Z1 and Z2 are directly connected together.

Gate electrode 1 of the high-frequency transistor has a significantly low input impedance such as several Ω within a high frequency range higher than or equal to the frequency of microwaves. Adjustment of the characteristic impedances within an as low as possible range is advantages in impedance matching at a desired fundamental frequency band. The adjustable range of characteristic impedance X of each impedance adjustment circuit 4 will be described below.

In FIG. 5, the mismatch loss hits the minimum, when impedance adjustment circuit 4 has characteristic impedance X of 20.6Ω. The requirement, where adjustment circuit 4 with characteristic impedance Xa is connected between the elements with different characteristic impedances Z1 and Z2, and has the minimum mismatch loss, is represented by Equation (6).

Half Xb of the sum of different characteristic impedances Z1 and Z2 is represented by Equation (7).

$$Xa = (Z1 * Z2)^{(1/2)} \qquad (6)$$

$$Xb = (Z1 + Z2) * 1/2 \qquad (7)$$

Since Xa≤Xb here, Xa is lower than or equal to half Xb of the sum of different characteristic impedances Z1 and Z2. That is, characteristic impedance X of impedance adjustment circuit 4 is adjusted to be lower than or equal to an intermediate value between Z1 and Z2. This adjustment sets the adjustable range of impedance adjustment circuit 4 to be narrowed toward lower impedances without excluding the minimum point of the loss caused by the mismatch between the characteristic impedances. For example, characteristic impedance X of impedance adjustment circuit 4 may satisfy Equation (7a).

$$X < (Z1 + Z2) * 1/2 \qquad (7a)$$

Where the characteristic impedances are 85Ω and 5Ω as described above, characteristic impedance X of impedance adjustment circuit 4 is adjusted to fall within 5Ω≤X≤45Ω. This adjustment reduces the mismatch loss at all frequency bands, and is advantages in impedance matching at a desired fundamental frequency band.

Figure 6:
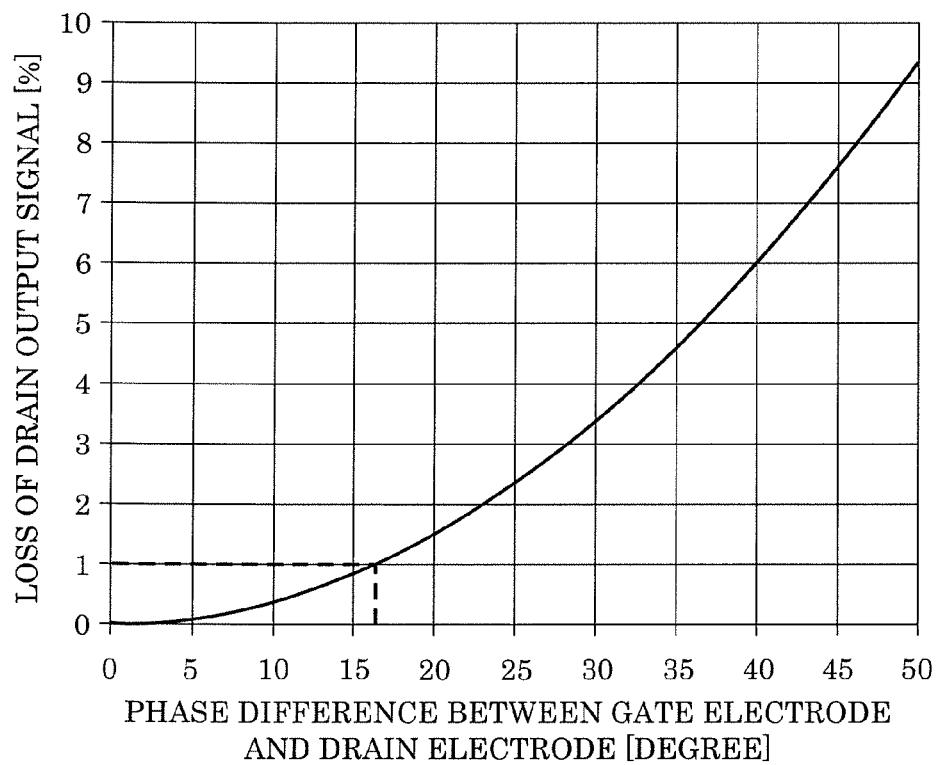
FIG. 6 illustrates loss of a drain output signal with respect to the phase difference between a gate electrode and a drain electrode.

Assume that impedance adjustment circuit 4, which has characteristic impedance X and connects elements with different characteristic impedances Z1 and Z2, has a line length of λ/4. In this case, the waves reflected at the connecting points are completely canceled within the line. Thus, further reduction of the mismatch loss is possible. However, an increase in the line length of the circuit with characteristic impedance X leads to an increase in the phase difference at the connecting point between drain electrode 2 and gate electrode 1. To determine the line length of the circuit with characteristic impedance X, the phase difference between drain electrode 2 and gate electrode 1 is to be considered. FIG. 6 illustrates loss of a drain output signal with respect to the phase difference between gate electrode 1 and drain electrode 2. It is found from FIG. 6 that the phase difference of about 16° causes loss of about 1%. Therefore, if the loss of the drain output signal needs to fall within 1% at the connecting point, impedance adjustment circuit 4 with characteristic impedance X needs to have at a maximum, the line length that causes the amount of phase rotation to fall within 16° at a desired fundamental frequency.

How to reduce the mismatch loss has been described above using an example where the end of gate drive line 12, which is farther from gate bus line 16, is connected to one of the T-junctions of gate finger 11. Instead, one of the junctions of gate drive line 12 may be connected to one of the junctions of gate finger 11, or the end of gate finger 11, which is closer to gate bus line 16. Alternatively, the connection may be established between the ones of the ends of gate drive line 12 and gate finger 11, which are father from the gate bus line. In any case, characteristic impedance X of the associated impedance adjustment circuit may be set to reduce the mismatch loss in the same or similar manner.

As described above, the high-frequency transistor according to Embodiment 1 includes semiconductor substrate 7, source electrode 3, drain electrode 2, gate electrode 1, gate drive line 12, and impedance adjustment circuits 4. Source electrode 3, drain electrode 2, and gate electrode 1 are formed on or above semiconductor substrate 7. Gate drive line 12 is for applying a voltage to gate electrode 1. Impedance adjustment circuits 4 is connected between gate electrode 1 and gate drive line 12. Gate electrode 1 has characteristic impedance Z1, when the connecting point between each impedance adjustment circuit 4 and gate electrode 1 is viewed from impedance adjustment circuit 4. Gate drive line 12 has characteristic impedance Z2, when the connecting point between each impedance adjustment circuit 4 and gate drive line 12 is viewed from impedance adjustment circuit 4. Characteristic impedance X of impedance adjustment circuit 4 is a value between Z1 and Z2.

This configuration including impedance adjustment circuits 4 allows a high-frequency transistor to provide the following advantages, even if the number of fingers is increased longitudinally to increase the total gate width. The transistor reduces the mismatch loss to be generated when a signal is input to gate electrode 1, and the phase difference between gate electrode 1 and drain electrode 2, to achieve high gain performance and high efficiency characteristics.

Here, characteristic impedance X may satisfy $X<(Z1+Z2)*\tfrac{1}{2}$.

This configuration further reduces the mismatch loss.

Here, the high-frequency transistor may include a plurality of impedance adjustment circuits 4, via which gate electrode 1 may be connected to gate drive line 12 in a plurality of positions.

This configuration reduces voltage drop at the end of the gate electrode, which is father from the gate drive line.

Here, the transistor may include gate bus line 16 that transmits signals to gate drive line 12. The end of gate electrode 1, which is closer to gate bus line 16, may be connected to gate drive line 12 via a single impedance adjustment circuit 4. The part of gate electrode 1 other than the ends may be connected to gate drive line 12 via another single impedance adjustment circuit 4.

This configuration further facilitates reduction in voltage drop at the end of the gate electrode, which is farther from the gate drive line.

Here, the circuit may include ground conductive film 5 and a source potential layer. Ground conductive film 5 is formed on the one of two principal surfaces of semiconductor substrate 7, which is opposite to the one provided with impedance adjustment circuits 4. The source potential layer has the same potential as source electrode 3. The source potential layer may be formed above both of gate electrode 1 and impedance adjustment circuits 4.

In this configuration, the impedance adjustment circuit has a stripline structure, and facilitates theoretical designing or adjustment of characteristic impedance X.

Embodiment 2

Next, a high-frequency transistor according to Embodiment 2 will be described.

In Embodiment 1, impedances are converted at the two connecting points of each impedance adjustment circuit 4. That is, two impedance conversions are performed. In Embodiment 2, a high-frequency transistor will be described, which includes impedance adjustment circuits 4 performing three or more impedance conversions.

The high-frequency transistor according to Embodiment 2 has the same configurations as in FIG. 3 except the following points. The description of the same configurations will be omitted, and the differences will be mainly described. In Embodiment 1, each impedance adjustment circuit 4 is a single impedance circuit (e.g., a single stripline 41). By contrast, in Embodiment 2, impedance adjustment circuit 4 is a series circuit of a plurality of impedance circuits (or impedance elements).

Figure 7A:
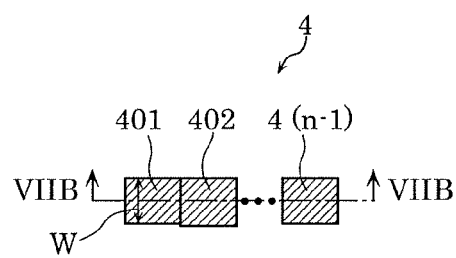
FIG. 7A is a plan view illustrating a configuration example of an impedance adjustment circuit according to Embodiment 2 including (n–1) impedance circuits connected in series.
Figure 7B:
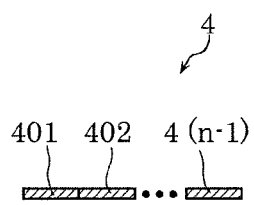
FIG. 7B is a cross-sectional view taken along line VIIB-VIIB of FIG. 7A.

FIG. 7A is a plan view illustrating a configuration example of an impedance adjustment circuit according to Embodiment 2 including (n−1) impedance circuits connected in series. FIG. 7B is a cross-sectional view taken along line VIIB-VIIB of FIG. 7A.

As shown in FIGS. 7A and 7B, impedance adjustment circuit 4 includes first impedance circuit 401 and second impedance circuit 402, . . . , and (n−1)th impedance circuit 4(n−1), which are connected in series. That is, impedance adjustment circuit 4 is a series circuit of (n−1) impedance circuits. Here, n is an integer of 2 or greater. Where n=2, the circuit corresponds to impedance adjustment circuits 4 according to Embodiment 1. Impedance adjustment circuit 4 according to Embodiment 2 as a series circuit is valid, where n is 3 or greater.

First impedance circuit 401, second impedance circuit 402, . . . , and (n−1)th impedance circuit 4(n−1) have characteristic impedances X1, X2, . . . , and X(n−1), respectively.

Figure 8:
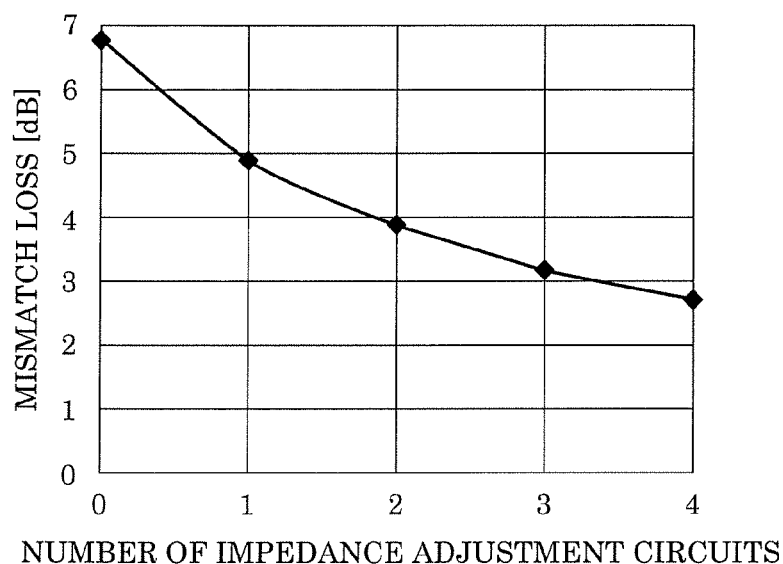
FIG. 8 illustrates the magnitude of mismatch loss with respect to the number of impedance circuits, where the characteristic impedances of the impedance circuits belonging to the impedance adjustment circuit according to Embodiment 2 are improved as much as possible.

FIG. 8 illustrates the magnitude of mismatch loss with respect to the number of impedance circuits, where the characteristic impedances of the impedance circuits belonging to impedance adjustment circuit 4 according to Embodiment 2 are improved as much as possible.

In FIG. 8, the horizontal axis represents the number of impedance circuits that constitute impedance adjustment circuit 4 and are connected in series. The vertical axis represents the mismatch loss, which occurs where impedance adjustment circuit 4 is inserted between lines with different characteristic impedances, namely Z2=85Ω and Z1=5Ω. It is apparent that an increase in the number of impedance circuits constituting the impedance adjustment circuit further reduce the mismatch loss.

Characteristic impedances X1 to Xn−1 of the n−1 impedance circuits, which reduce the mismatch loss as much as possible, are calculated from Equation (8), where $Z1<X1 \ldots <Xn-1<Z2$. Note that n is an integer of 2 or greater.

$$X1 = Z1^{\wedge}(n-1/n) \times Z2^{\wedge}(1/n)$$
$$X2 = Z1^{\wedge}(n-2/n) \times Z2^{\wedge}(2/n)$$
$$\vdots$$
$$Xn-1 = Z1^{\wedge}(1/n) \times Z2^{\wedge}(n-1/n)$$
(8)

Then, impedance adjustment circuit 4 including two impedance circuits, that is, where n=3, will be described.

Figure 9A:
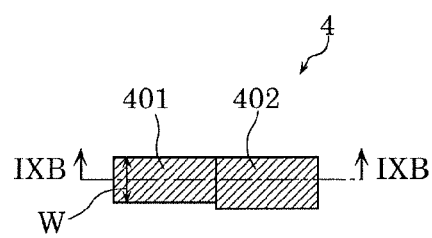
FIG. 9A is a plan view illustrating a configuration example of the impedance adjustment circuit according to Embodiment 2 including two impedance circuits connected in series.
Figure 9B:
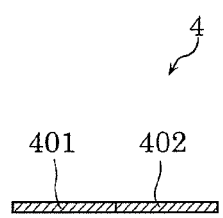
FIG. 9B is a cross-sectional view taken along line IXB-IXB of FIG. 9A.

FIG. 9A is a plan view illustrating a configuration example of impedance adjustment circuit 4 according to Embodiment 2 including two impedance circuits connected in series. FIG. 9B is a cross-sectional view taken along line IXB-IXB of FIG. 9A.

FIGS. 9A and 9B, impedance adjustment circuit 4 is a series circuit of first impedance circuit 401 and second impedance circuit 402 with a higher characteristic impedance than first impedance circuit 401.

First, the characteristic impedances of first impedance circuit 401 and second impedance circuit 402 will be described, which aim to reduce the mismatch loss as much as possible.

If impedance adjustment circuit 4 is a series circuit of two impedance elements with two characteristic impedances X1a and X2a, the values of characteristic impedances X1a and X2a for reducing the mismatch loss as much as possible, where $Z1<X1a<X2a<Z2$, are obtained from Equation (9) rather than from Equation (8).

$$X1a = Z1^{\wedge}(2/3) \times Z2^{\wedge}(1/3)$$
$$X2a = Z1^{\wedge}(1/3) \times Z2^{\wedge}(2/3)$$
(9)

Next, the ranges of characteristic impedances X1 and X2 of first impedance circuit 401 and second impedance circuit 402 for properly reducing the mismatch loss will be described.

Assume that X1b and X2b are characteristic impedances that divide the range between different characteristic impedances Z1 and Z2 right into three. Where $Z1<X1b<X2b<Z2$, X1b and X2b are calculated from Equation (10).

$$X1b = Z1 + (Z2-Z1)/3$$
$$X2b = Z1 + 2*(Z2-Z1)/3$$
(10)

Here, $X1a \leq X1b$, $X2a \leq X2b$. Thus, if two elements with characteristic impedances X1 and X2 are inserted into impedance adjustment circuit 4, the ranges are set to satisfy Equation (11). This setting properly sets the adjustable range of impedance adjustment circuits 4 to be narrowed toward lower impedances without excluding the minimum point of the loss caused by the mismatch between the characteristic impedances.

$$X1 \leq Z1 + (Z2+Z1)/3$$
$$X2 \leq Z1 + 2*(Z2-Z1)/3$$
(11)

Note that $Z1<X1<X2<Z2$.

In Embodiments 1 and 2, each impedance adjustment circuit 4 is connected to gate electrode 1 that has a low characteristic impedance and includes source field plate 33. Characteristic impedance X of such a circuit need to be set low to reduce the mismatch loss. In gate electrode 1 of FIG. 3, the source field plate may have various shapes in accordance with required high frequency characteristics or breakdown characteristics. The connecting point between impedance adjustment circuits 4 and gate electrode 1 viewed from impedance adjustment circuit 4 generally has characteristic impedance Z1 within a range from about 3Ω to about 65Ω. Therefore, characteristic impedance X of impedance adjustment circuit 4 also needs to be adjusted to fall within this range. However, a low characteristic impedance such as several Ω is achieved only by the stripline configuration like gate electrode 1, which includes source field plate 33 and is vertically interposed between the ground planes.

As shown in FIG. 4A, impedance adjustment circuit 4 includes stripline 41 overlapping the source potential layer with the same potential as source electrode 3. This configuration allows for adjustment of characteristic impedance X including a particularly low value. In FIG. 3, the source potential layer is connected to via holes 34 provided between the plurality of impedance adjustment circuits 4. The source potential layer is, however, not necessarily adjacent to gate finger 11. The source potential layer may be connected to a via hole provided in another position.

In the cross-sectional configuration taken along line IVA-IVA of FIG. 4A, source field plate 33 is connected to source electrode 3 near and above the position where impedance adjustment circuit 4 is connected to gate electrode 1. This configuration allows for design of impedance adjustment circuit 4 to stably have a low characteristic impedance to the connecting point between the circuit and gate electrode 1. Even if gate fingers 11 are longitudinally stacked one above the other, this configuration allows source field plate 33 to maintain the same potential as source electrode 3.

Next, adjustment of the characteristic impedance of impedance adjustment circuit 4 with a stripline structure will be described.

Figure 10:
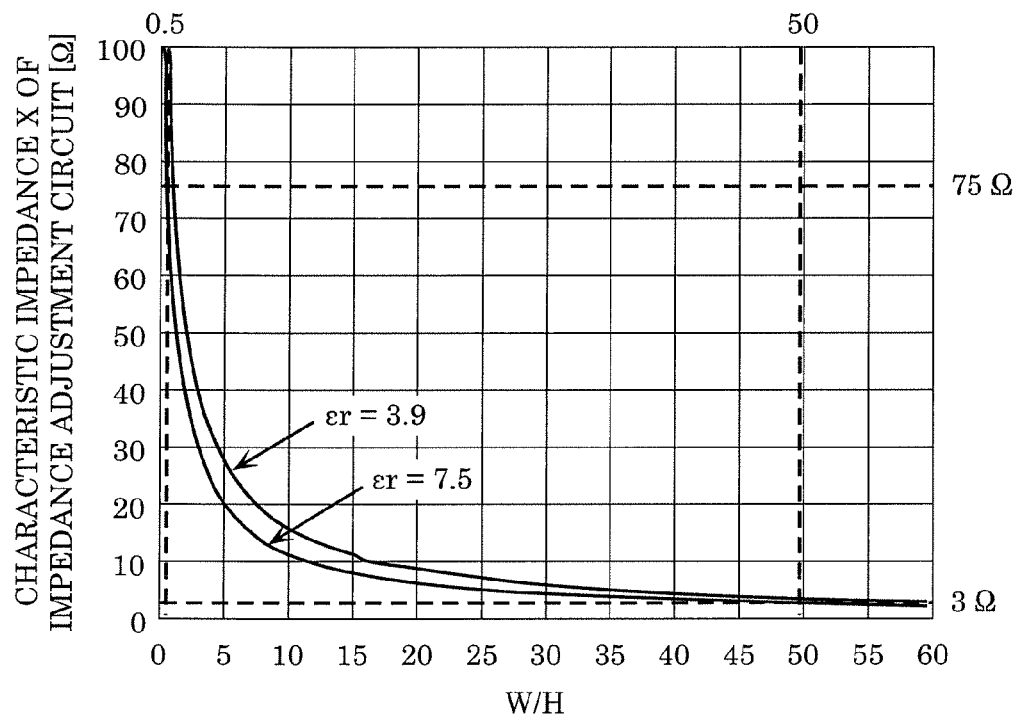
FIG. 10 illustrates the magnitude of the characteristic impedance of the impedance adjustment circuit according to Embodiment 2 with respect to the ratio W/H of the width of a line with a stripline structure of to the thickness of a dielectric film.

FIG. 10 illustrates the magnitude of the characteristic impedance of each impedance adjustment circuit 4 according to Embodiments 1 and 2 with respect to ratio W/H of width W of a line with a stripline structure to thickness H of the dielectric film. Here, "width W of a line" is the width of stripline 41 of each impedance adjustment circuit 4 as shown in FIG. 3. The "thickness of the dielectric film" is the thickness of dielectric film 6 interposed between stripline 41 and the source potential layer as shown in FIG. 4A. Thickness H of dielectric film 6 is also the distance between stripline 41 and the source potential layer. Dielectric film 6 is generally made of silicon nitride or silicon dioxide. Dielectric constant εr of dielectric film 6 is, for example, about 7.5, where dielectric film 6 is made of $Si_3N_4$, and about 3.9, where dielectric film 6 is made of $SiO_2$.

There is a relation shown in FIG. 10 between characteristic impedance X of impedance adjustment circuit 4 and W/H. Here, gate electrode 1 including source field plate 33 has a characteristic impedance within a range from about 6Ω to about 65Ω in accordance with the shape of gate electrode 1, which depends on desired high frequency characteristics and breakdown characteristics. If gate drive line 12 has a microstripline structure similar to the configuration of drain finger 21, characteristic impedance X of impedance adjustment circuit 4 needs to be adjusted to fall within the range of $3\Omega \leq X \leq 78\Omega$. In view of the fact that dielectric film 6 has a dielectric constant of about 7.5 or about 3.9, impedance adjustment circuit 4 with reduced mismatch loss is achieved when W/H falls within a range satisfying the requirement of 0.5≤W/H≤50.

As described above, in the high-frequency transistor according to Embodiment 2, impedance adjustment circuit 4 may be a series circuit of a plurality of impedance circuits. Specifically, impedance adjustment circuit 4 is a series circuit of first impedance circuit 401 with characteristic impedance X1 and second impedance circuit 402 with characteristic impedance X2 that is higher than characteristic impedance X1. Assume that the lower one of characteristic impedance Z1 and characteristic impedance Z2 is Zs, and the higher one is Zb. Then, characteristic impedance X1 and characteristic impedance X2 satisfy X1≤Zs+(Zb−Zs)*⅓ and X2≤Zs+(Zb−Zs)*⅔, respectively. First impedance circuit 401 is connected to the one of gate electrode 1 and gate drive line 12, which has characteristic impedance Zs, whereas second impedance circuit 402 is connected to the other with characteristic impedance Zb.

This configuration increases the number of impedance conversions performed by impedance adjustment circuit 4 to three times, thereby further reducing the mismatch loss.

In other words, impedance conversions are performed in the first to third connecting points, respectively. The first connecting point is the connecting point between impedance adjustment circuit 4 and gate electrode 1 (i.e., gate finger 11). The second connecting point is the connecting point between impedance adjustment circuit 4 and gate drive line 12. The third connecting point is the connecting point between the first impedance circuit and the second impedance circuit. Reduction in the reflection at the connecting points further reduces the mismatch loss.

Each impedance adjustment circuit 4 may include stripline 41. Line width W of stripline 41 and distance H between stripline 41 and the source potential layer may satisfy 0.5≤W/H≤50.

This configuration further facilitates designing or adjustment of characteristic impedance X.

Embodiment 3

Figure 11:
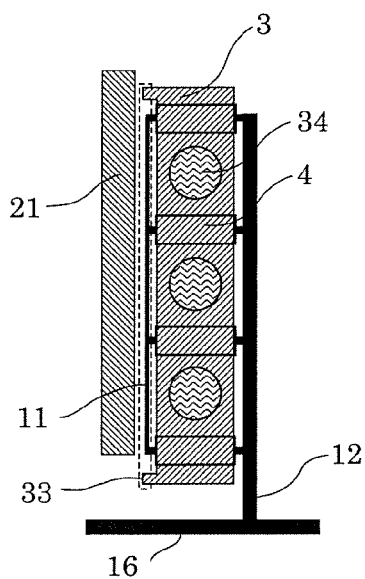
FIG. 11 is a schematic plan view illustrating a configuration example of a high-frequency transistor according to Embodiment 3.

FIG. 11 is a schematic plan view illustrating a configuration example of a high-frequency transistor according to Embodiment 3 of the present disclosure. The high-frequency transistor of FIG. 11 includes additional impedance adjustment circuit 4, unlike in FIG. 3. The differences will be mainly described below. The additional impedance adjustment circuit 4 connects the one of the ends of gate electrode 1 (i.e., gate finger 11), which is farther from gate bus line 16, to the one of the ends of gate drive line 12, which is farther from gate bus line 16. That is, FIG. 11 illustrates that impedance adjustment circuit 4 is also connected between the ending point of gate drive line 12 and the ending point of gate finger 11, unlike in the high-frequency transistor according to Embodiment 1 shown in FIG. 3.

Figure 12:
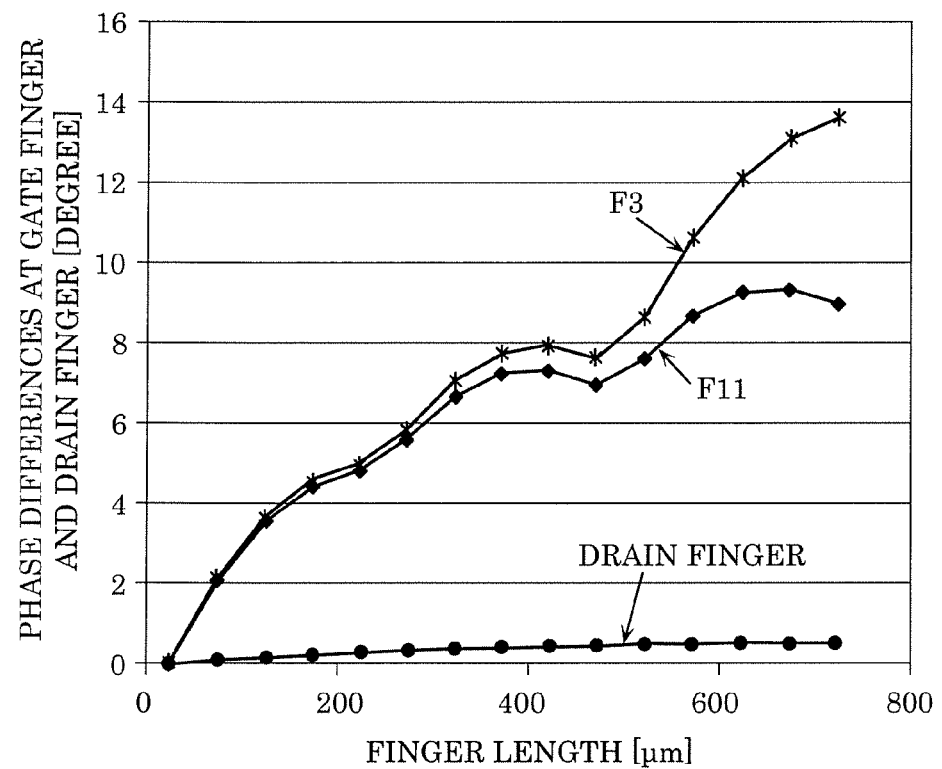
FIG. 12 illustrates the phase difference generated at a drain finger and the phase difference generated at a gate finger with respect to the lengths of the fingers.

FIG. 12 illustrates the phase difference generated at drain finger 21 and phase difference generated at gate finger 11 with respect to the finger lengths. In the figure, the curve "F3" represents the phase difference generated at gate finger 11 shown in FIG. 3. The curve "F11" represents the phase difference generated at gate finger 11 shown in FIG. 11. The curve of "drain finger" represents the phase difference generated at drain finger 21 in FIG. 3 or 11. Each curve represents the phase difference generated when a voltage signal with a frequency of 3.5 GHz is applied to gate finger 11 via gate bus line 16, gate drive line 12, and impedance adjustment circuit 4. In FIG. 12, the X-axis represents the finger lengths, whereas the Y-axis represents the phase difference between a reference point and each finger. In each of the X- and Y-axes, the reference point of gate finger 11 is the starting point, whereas the reference point of drain finger 21 is the finger end adjacent to the starting point of gate finger 11. As shown in FIG. 12, the phase difference at gate finger 11 of FIG. 3 appears unchanged, since the ending point of gate finger 11 is not connected to gate drive line 12. By contrast, the phase difference at gate finger 11 of FIG. 11 improves by about 4° at the finger length of 725 μm as the effect of connecting the ending point of gate finger 11 to gate drive line 12 via impedance adjustment circuit 4.

In the FET of FIG. 11, the characteristic impedances of impedance adjustment circuits 4 disposed at all the connecting points between gate finger 11 and gate drive line 12 are adjustable in the same or similar manner as in Embodiments 1 and 2.

As described above, the high-frequency transistor according to Embodiment 3 includes gate bus line 16 that transmits signals to gate drive line 12. The one of the ends of gate electrode 1, which is closer to gate bus line 16, is connected to gate drive line 12 via one of impedance adjustment circuits 4. The other of the ends of gate electrode 1, which is farther from gate bus line 16, is connected to gate drive line 12 via another one of single impedance adjustment circuit 4.

This configuration further facilitates reduction in the phase difference and voltage drop generated at the end of gate electrode 1, which is farther from gate bus line 16.

Embodiment 4

Figure 13:
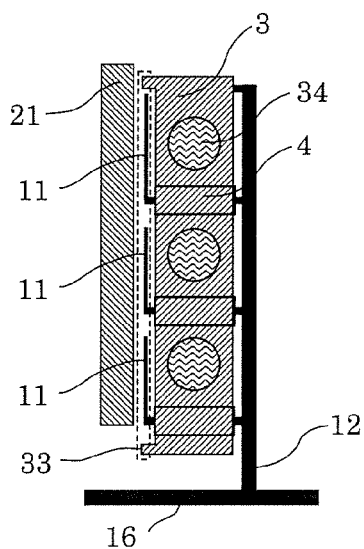
FIG. 13 is a schematic plan view of a high-frequency FET according to Embodiment 4.

FIG. 13 is a schematic plan view illustrating a configuration example of a high-frequency transistor according to Embodiment 4. The high-frequency transistor shown in FIG. 13 includes a plurality of gate electrodes 1 (i.e., gate fingers 11) instead of single gate electrode 1 (i.e., gate finger 11) in FIG. 3. The differences will be mainly described below.

The plurality of gate electrodes 1 (i.e., gate fingers 11) are spaced apart from each other and arranged in a straight line. The ones of the ends of the plurality of gate electrodes 1, which are closer to gate bus line 16, are connected to gate drive line 12 via respective impedance adjustment circuits 4. That is, in FIG. 13, the end of gate finger 11 of FIG. 3, which is closer to gate bus line 16, is divided into the plurality of gate fingers 11 at the T-junctions of gate finger 11 connected to gate drive line 12, unlike the high-frequency transistor according to Embodiment 1 shown in FIG. 3.

Figure 14:
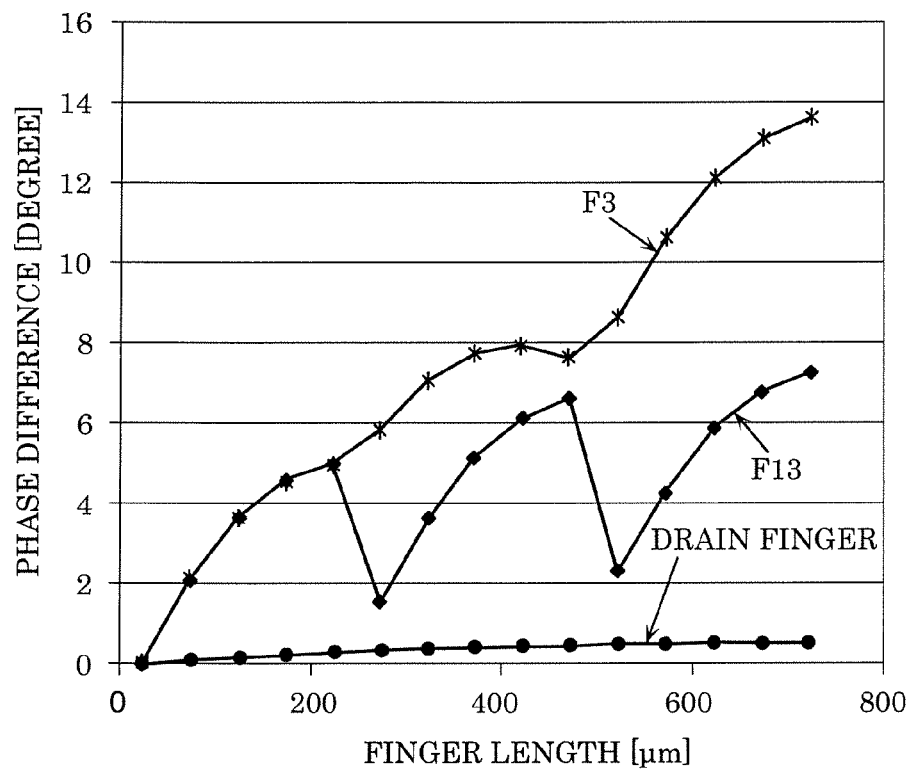
FIG. 14 illustrates the phase difference generated at a drain finger and the phase difference generated at a gate finger with respect to the lengths of the fingers.

FIG. 14 illustrates the phase difference generated at drain finger 21 and the phase difference generated at gate finger 11 with respect to the finger lengths. In the figure, the curve "F3" represents the phase difference generated at gate finger 11 shown in FIG. 3. The curve "F13" represents the phase difference generated at the plurality of gate fingers 11 arranged in the straight line as shown in FIG. 13. The curve of "drain finger" represents the phase difference generated at drain finger 21 in FIG. 3 or 13. Each curve represents the phase difference generated when a voltage signal with a frequency of 3.5 GHz is applied to the plurality of gate fingers 11 via gate bus line 16, gate drive line 12, and the plurality of impedance adjustment circuits 4.

As shown in FIG. 14, the gate finger is divided into the plurality of gate fingers 11. Thus, the phase differences between the fingers and gate drive line 12 are canceled at the respective connecting points to decrease and come closer to the phase difference at drain finger 21. As compared to Embodiment 1 shown in FIG. 3, the phase difference at gate fingers 11 improves by about 7° at the finger length of 725 µm. As compared to Embodiment 3 shown in FIG. 11, the phase difference improves by about 3°. The high-frequency transistor of FIG. 13 may also reduce the phase difference by connecting the ending point of gate drive line 12 to the ending point of gate finger 11 via impedance adjustment circuit 4, as in FIG. 11.

In the high-frequency transistor of FIG. 13, the characteristic impedances of impedance adjustment circuits 4 disposed at all the connecting points between gate fingers 11 and gate drive line 12 are adjustable in the same or similar manner as in Embodiments 1 and 2.

As described above, the high-frequency transistor according to Embodiment 4 includes the plurality of gate electrodes 1 (i.e., the plurality of gate fingers 11), the plurality of impedance adjustment circuits 4, and includes gate bus line 16 that transmits signals to gate drive line 12. The plurality of gate fingers 11 are spaced from each other and arranged in the straight line. The ones of the ends of the plurality of gate fingers 11, which are closer to gate bus line 16, are connected to gate drive line 12 via respective impedance adjustment circuits 4.

This configuration further facilitates reduction in the phase difference between gate electrode 1 and drain electrode 2.

Embodiment 5

Figure 15:
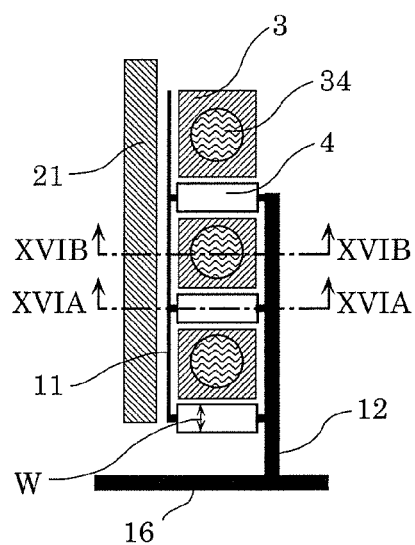
FIG. 15 is a schematic plan view illustrating a configuration example of a high-frequency transistor according to Embodiment 5.
Figure 16A:
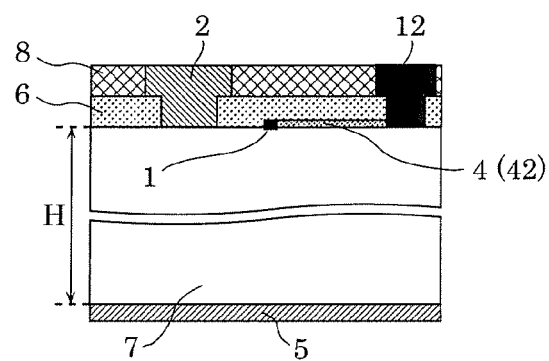
FIG. 16A is a cross-sectional view of the high-frequency transistor according to Embodiment 5 taken along line XVIA-XVIA.
Figure 16B:
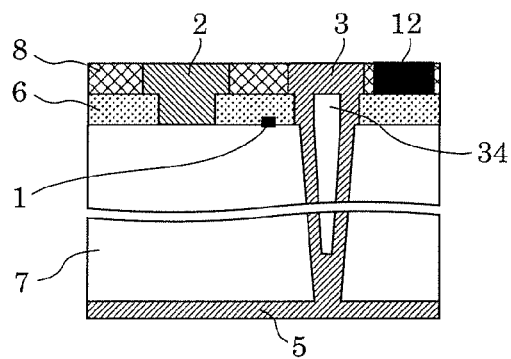
FIG. 16B is a cross-sectional view of the high-frequency transistor according to Embodiment 5 taken along line XVIB-XVIB.

FIG. 15 is a schematic plan view illustrating a configuration example of a high-frequency transistor according to Embodiment 5 of the present disclosure. FIG. 16A is a cross-sectional view taken along line XVIA-XVIA of FIG. 15. FIG. 16B is a cross-sectional view taken along line XVIB-XVIB of FIG. 15.

The high-frequency transistor shown in FIGS. 15, 16A, and 16B includes no source field plate 33 above gate electrode 1, and no source potential layer with the same potential as source electrode 3 above impedance adjustment circuits 4, unlike the transistor according to Embodiment 1 shown in FIGS. 3, 4A, and 4B. The differences will be mainly described below.

Gate electrode 1 has a microstripline structure, which includes no source field plate 33 as a ground plane above gate electrode 1, and ground conductive film 5 as a ground plane below gate electrode 1.

Each impedance adjustment circuit 4 has microstripline 42 as a microstripline structure. The structure includes no source potential layer as a ground plane above impedance adjustment circuit 4, and ground conductive film 5 as a ground plane below impedance adjustment circuit 4.

As described above, gate electrode 1 has no source field plate above gate electrode 1. Thus, gate electrode 1 and gate finger 11 have a high characteristic impedance. As shown in FIG. 16A, gate electrode 1 has a microstripline structure including ground conductive film 5 located on the back surface of semiconductor substrate 7. Since a typical semiconductor substrate has a thickness within a range from about 50 µm to about 200 µm, gate electrode 1 has a high characteristic impedance of about 150Ω.

Here, even if gate electrode 1 has no source field plate and has a high characteristic impedance, the characteristic impedance of each impedance adjustment circuit 4 can be set in the same or similar manner as Embodiment 1.

For example, assume that, in the high-frequency transistor shown in FIG. 15, gate drive line 12 has a characteristic impedance of 100Ω, and gate finger 11 has a characteristic impedance of 150Ω. Gate drive line 12 is connected to the end of gate finger 11, which is closer to gate bus line 16. In this case, the characteristic impedance at the junction of gate drive line 12 is 50Ω as viewed from gate finger 11, and the characteristic impedance at the connecting point of gate finger 11 is 150Ω as viewed from gate drive line 12. Here, Z1 is 50Ω and Z2 is 150Ω. Impedance adjustment circuits 4 with characteristic impedance X are inserted between the points with these characteristic impedances.

Figure 17:
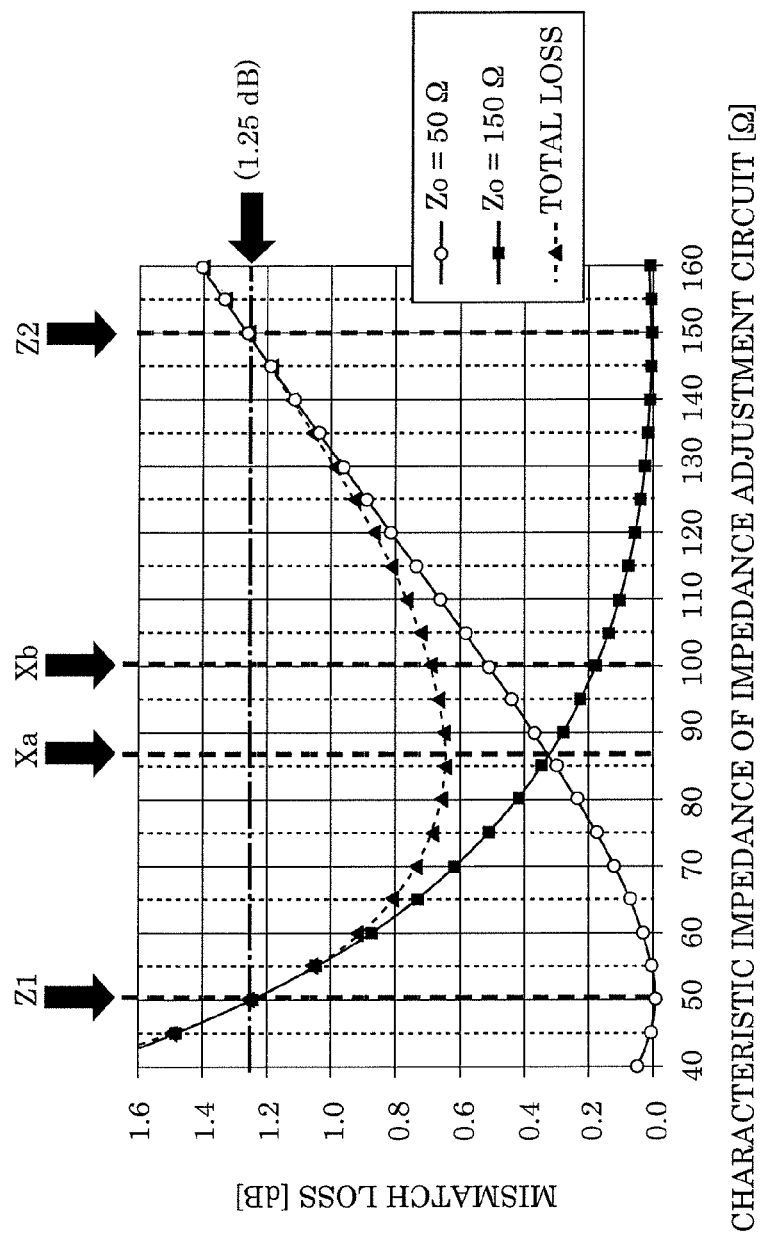
FIG. 17 is a graph for setting characteristic impedance X of the impedance adjustment circuit according to Embodiment 5.

FIG. 17 is a graph for setting the magnitude of the mismatch loss with respect to characteristic impedance X of impedance adjustment circuit 4 according to this embodiment. How to see the curves in this figure is the same as in FIG. 5. FIG. 17 is a graph illustrating the mismatch loss (Y-axis) calculated from Equation (5), when the connecting points with characteristic impedances of 50Ω and 150Ω are connected to one of impedance adjustment circuits 4, with the characteristic impedance (X-axis), according to the present disclosure. In FIG. 17, the total mismatch loss where the points with characteristic impedances of 50Ω and 150Ω are connected to impedance adjustment circuit 4 with the same characteristic impedance (X-axis) is represented by the dashed line with black circles.

See the total mismatch loss in FIG. 17 in the ranges of characteristic impedances (50Ω≤X≤150Ω) of the points connected to impedance adjustment circuit 4 with characteristic impedance X. The total mismatch loss between the characteristic impedances of impedance adjustment circuit 4 and 50Ω and between the characteristic impedances of impedance adjustment circuit 4 and 150Ω is smaller than 1.25 dB. The value 1.25 dB is the mismatch loss calculated from Equation (5) when the points with the characteristic impedances 50Ω and 150Ω are directly connected.

In this manner, the characteristic impedances at the connecting points between impedance adjustment circuit 4 and gate finger 11 and between impedance adjustment circuit 4 and gate drive line 12 are Z1 and Z2, respectively, as viewed from impedance adjustment circuit 4. At this time, characteristic impedance X of impedance adjustment circuit 4 is adjusted to a value between Z1 and Z2. This reduces more mismatch loss than in the case where the points with Z1 and Z2 are directly connected.

Next, narrowing the adjustable range of characteristic impedance X of impedance adjustment circuit 4 will be described as in Embodiment 1.

In FIG. 17, the total mismatch loss hits the minimum, when impedance adjustment circuit 4 has characteristic impedance Xa=86.6Ω according to Equation (6). Half Xb of the sum of different characteristic impedances Z1 and Z2 is expressed by Xb=100Ω according to Equation (7). The relation Xa≤Xb can be also confirmed here. Thus, even if gate electrode 1 includes no source field plate and has a high characteristic impedance, characteristic impedance X of the impedance adjustment circuit is adjusted to be lower than or equal to half Xb of the sum of different characteristic impedances Z1 and Z2, that is, an intermediate value between Z1 and Z2. This adjustment properly sets the adjustable range of impedance adjustment circuit 4 to be narrowed toward lower impedances without excluding the minimum point of the loss caused by the mismatch between the characteristic impedances. Where the characteristic impedances are 50Ω and 150Ω as described above, characteristic impedance X of impedance adjustment circuit 4 is adjusted to fall within 50Ω≤X≤100Ω. This adjustment reduces the mismatch loss at all frequency bands, and is advantages in impedance matching at a desired fundamental frequency band. In addition, with the use of two impedance adjustment circuits, the ranges of the characteristic impedances can be set as in Embodiment 2.

If gate electrode 1 includes no source field plate 33 in this manner, gate electrode 1 has a high characteristic impedance. Thus, the characteristic impedance of impedance adjustment circuit 4 needs to be adjusted within this range. However, in the configuration according to Embodiment 1 where the stripline is close to and overlaps the source electrode, setting a high characteristic impedance over 80Ω is extremely difficult. To address the problem, as shown in FIG. 16A, source electrode 3 interposed between impedance adjustment circuits 4 is grounded using via holes 34. This allows impedance adjustment circuits 4 to have microstripline 42, which does not overlap source electrode 3, to enable adjustment of the characteristic impedance including a particularly high value.

Figure 18:
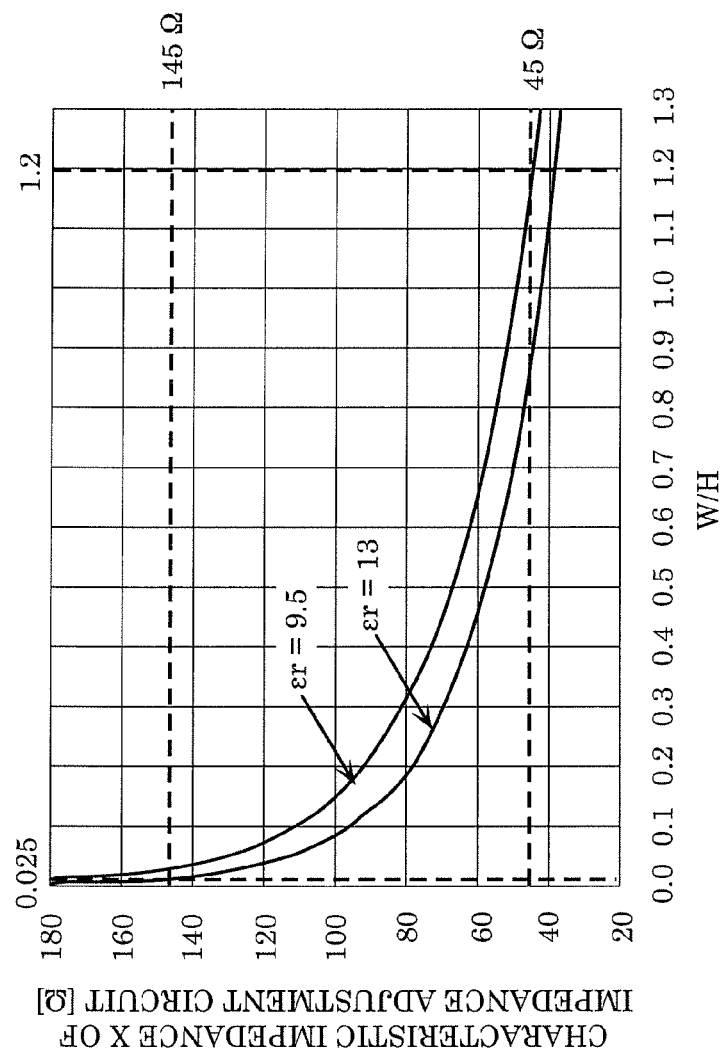
FIG. 18 illustrates the magnitude of a characteristic impedance with respect to the ratio W/H of the width of a line with a microstripline structure of the impedance adjustment circuit according to Embodiment 5 to the thickness of a dielectric film.

FIG. 18 illustrates the magnitude of the characteristic impedance of the impedance adjustment circuit according to Embodiment 5 with respect to ratio W/H of width W of a line with a microstripline structure to thickness H of a dielectric film. Here, thickness H represents the thickness of a dielectric body interposed between microstripline 42 and ground conductive film 5, and is the thickness of semiconductor substrate 7 as shown in FIG. 16A. Gate electrode 1 with no source field structure has characteristic impedance Z1 within a range from about 115Ω to about 200Ω. Thus, characteristic impedance X of impedance adjustment circuit 4 needs to be adjusted to fall within 45Ω≤X≤145Ω. Semiconductor substrate 7 is made of semiconductor such as Si, SiC, GaAs, and GaN, and thus has dielectric constant εr within a range from 9.5 to 13. In view of the fact, W/H satisfying the range of 0.025≤W/H≤1.2 provides an impedance adjustment circuit with reduced mismatch loss.

In the foregoing description, how to reduce the mismatch loss has been described using an example where one of the T-junctions of gate drive line 12 is connected to one of the ends of gate finger 11. Instead, the connection may be established between one of the junctions of gate drive line 12 and one of the junctions of gate finger 11, between one of the ends of gate drive line 12 and one of the T-junctions or ends of gate finger 11. In any case, characteristic impedance X of an impedance adjustment circuit may be set to reduce the mismatch loss in the same or similar manner.

Figure 19:
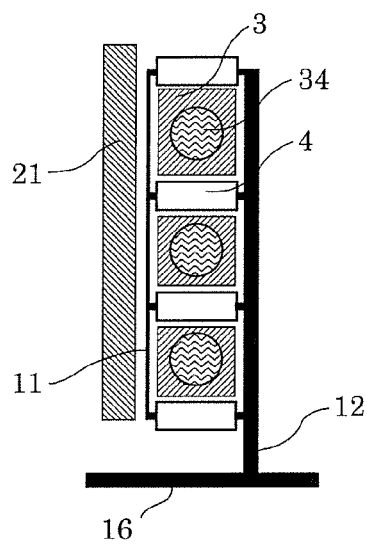
FIG. 19 is a schematic plan view illustrating another configuration example of the high-frequency transistor according to Embodiment 5, which is different from that in FIG. 15.

FIG. 19 is a schematic plan view illustrating another configuration example of the high-frequency transistor according to Embodiment 5, which is different from that in FIG. 15. In the high-frequency transistor shown in FIG. 19, the ending point of gate finger 11 is also connected to the ending point of gate drive line 12 via impedance adjustment circuit 4, unlike in Embodiment 5 shown in FIG. 15. This configuration further reduces the phase difference at gate finger 11.

Figure 20:
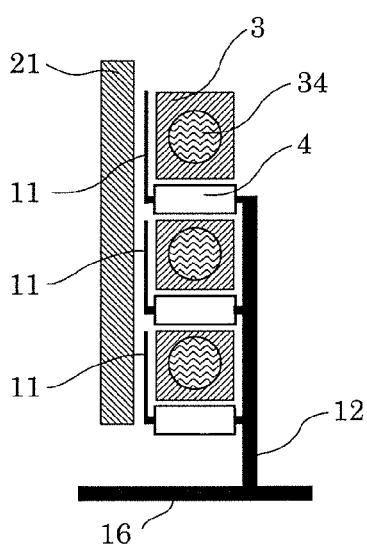
FIG. 20 is a schematic plan view illustrating a still another configuration example of the high-frequency transistor according to Embodiment 5, which is different from those in FIGS. 15 and 19.

FIG. 20 is a schematic plan view illustrating a still another configuration example of the high-frequency transistor according to Embodiment 5, which is different from those in FIGS. 15 and 19. In the high-frequency transistor shown in FIG. 20, the T-junctions of gate finger 11 connected to gate drive line 12 are cut at the ends closer to the starting point of gate finger 11 (i.e., closer to gate bus line 16), unlike in Embodiment 5 shown in FIG. 15. This configuration achieves reduction in the phase difference.

Note that, in the respective configurations of the high-frequency transistors described above, the interval of the connecting points between gate electrode 1 and gate drive line 12 via impedance adjustment circuits 4 is designed so that the phase difference falls within 16° at the gate finger as shown in FIG. 6. This causes the loss of the output signal of the drain to fall within 1%.

In the high-frequency transistors of FIGS. 19 and 20, the characteristic impedances of impedance adjustment circuits 4 disposed at all the connecting points between gate finger 11 and gate drive line 12 are adjustable in the same or similar manner as in Embodiments 1 and 2.

As described above, the high-frequency transistor according to Embodiment 5 includes ground conductive film 5 on the one of the two principal surfaces of the semiconductor substrate, which is opposite to the one provided with the impedance adjustment circuits. The circuit includes no source potential layer with the same potential as the source electrode above gate electrode 1 or impedance adjustment circuits 4.

In this configuration, impedance adjustment circuit 4 has a microstripline structure, which facilitates theoretical designing or adjustment of characteristic impedance X.

Here, impedance adjustment circuit 4 may have microstripline 42. Width W of microstripline 42 and distance H between microstripline 42 and ground conductive film 5 may satisfy 0.025≤W/H≤1.2.

This configuration further facilitates designing or adjustment of characteristic impedance X.

Embodiment 6

Figure 21:
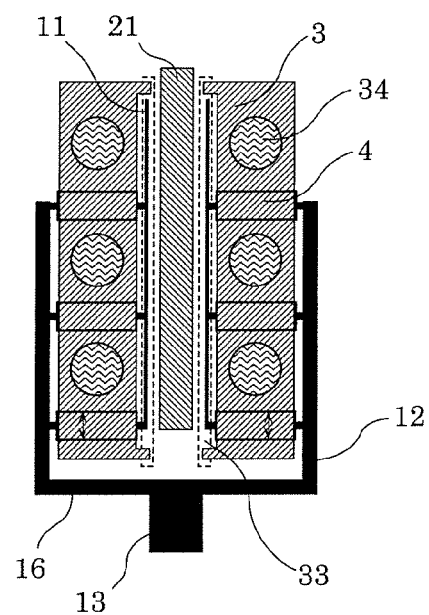
FIG. 21 is a schematic plan view illustrating a configuration example of a high-frequency transistor according to Embodiment 6.

FIG. 21 is a schematic plan view illustrating a configuration example of a high-frequency transistor according to Embodiment 6 of the present disclosure. FIG. 21 employs the high-frequency transistor shown in FIG. 3 as a basic cell. Gate fingers 11, gate drive lines 12, source electrodes 3, via holes 34, and impedance adjustment circuits 4 are mirror-symmetrically arranged with respect to drain finger 21. Gate drive lines 12 are connected together by gate bus line 16 that includes gate electrode pad 13 at the center. This configuration supplies signals for reducing phase differences to a single drain finger from right and left gate fingers. The same or similar configuration may be employed in FIGS. 11, 13, 15, 19, and 20, thereby providing the same advantages.

The interconnection of gate bus line 16 may function as the impedance adjustment circuit described above, thereby connecting gate bus line 16 to the end of gate finger 11, which is closer to gate bus line 16.

Embodiment 7

Figure 22:
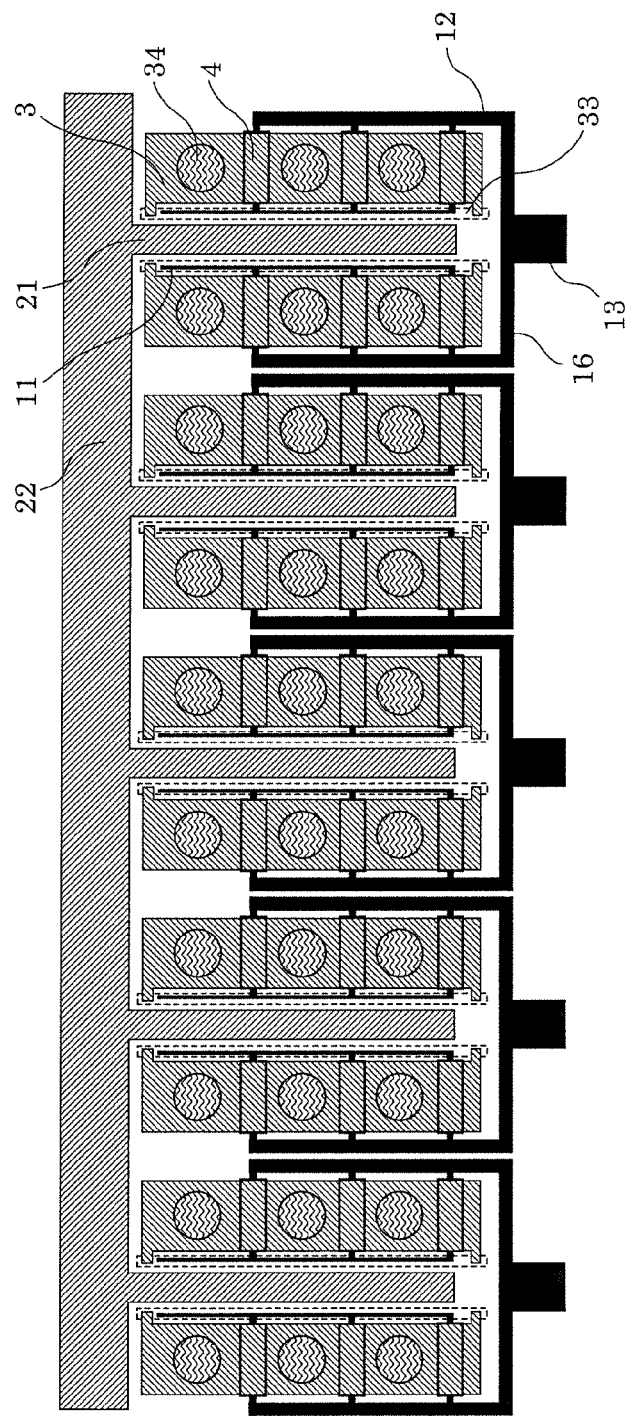
FIG. 22 is a schematic plan view illustrating a configuration example of a high-frequency transistor according to Embodiment 7.

FIG. 22 is a schematic plan view illustrating a configuration example of a high-frequency transistor according to Embodiment 7 of the present disclosure. FIG. 22 shows a multi-cell structure formed by arranging a plurality of unit cells of Embodiment 6 shown in FIG. 21 in the transverse direction of the fingers. Gate bus line 16 may connect the plurality of unit cells. Gate electrode pads 13 connected to gate bus line 16 may be arranged so that same phase signals are input to two gate drive lines 12 of a single unit cell. This reduces the number of electrode pads for each unit cell.

This structure increases the total gate width not only longitudinally, but also transversely as is usually the case.

While the embodiments of the present disclosure have been described above, the present disclosure is not limited to the embodiments with the characteristics described above. Various variations and modifications may be made within the scope and spirit of the present disclosure recited in the claims.

INDUSTRIAL APPLICABILITY

The high-frequency transistor according to the present disclosure is a high-frequency field-effect transistor including an impedance adjustment circuit that reduces the mismatch loss between a gate electrode and a line applying a voltage to the gate electrode. The transistor is useful as, for example, a high-frequency transistor with a greater total gate width.

What is claimed is:

1. A high-frequency transistor, comprising:
    a semiconductor substrate;
    a source electrode on the semiconductor substrate;
    a drain electrode on the semiconductor substrate;
    a gate electrode on the semiconductor substrate;
    a gate drive line for applying a voltage to the gate electrode; and
    an impedance adjustment circuit connected between the gate electrode and the gate drive line, wherein
    X that denotes a characteristic impedance of the impedance adjustment circuit is a value between Z1 and Z2, where
        a characteristic impedance of the gate electrode is Z1, when a connecting point between the impedance adjustment circuit and the gate electrode is viewed from the impedance adjustment circuit, and
        a characteristic impedance of the gate drive line is Z2, when a connecting point between the impedance adjustment circuit and the gate drive line is viewed from the impedance adjustment circuit.

2. The high-frequency transistor according to claim 1, wherein
    X satisfies $X<(Z1+Z2)*\frac{1}{2}$.

3. The high-frequency transistor according to claim 1, wherein
    the impedance adjustment circuit is a series circuit of:
        a first impedance circuit with a characteristic impedance denoted by X1; and
        a second impedance circuit with a characteristic impedance denoted by X2 higher than X1,
    X1 and X2 satisfy $X1 \leq Zs+(Zb-Zs)*\frac{1}{3}$ and $X2 \leq Zs+(Zb-Zs)*\frac{2}{3}$, respectively, where Zs is a lower one of Z1 and Z2, and Zb is a higher one of Z1 and Z2,
    the first impedance circuit is connected to one of the gate electrode and the gate drive line, which has Zs, and
    the second impedance circuit is connected to one of the gate electrode and the gate drive line, which has Zb.

4. The high-frequency transistor according to claim 1, further comprising:
    a plurality of impedance adjustment circuits, each of which is the impedance adjustment circuit, wherein
    the gate electrode is connected to the gate drive line in a plurality of positions via the respective impedance adjustment circuits.

5. The high-frequency transistor according to claim 4, further comprising:
    a gate bus line that transmits a signal to the gate drive line, wherein
    one of ends of the gate electrode, which is closer to the gate bus line, is connected to the gate drive line via one of the impedance adjustment circuits, and
    an other of the ends of the gate electrode, which is farther from the gate bus line, is connected to the gate drive line via another one of the impedance adjustment circuits.

6. The high-frequency transistor according to claim 4, further comprising:
    a gate bus line that transmits a signal to the gate drive line, wherein
    one of ends of the gate electrode, which is closer to the gate bus line, is connected to the gate drive line via one of the impedance adjustment circuits, and
    a part of the gate electrode other than ends of the gate electrode is connected to the gate drive line via another one of the impedance adjustment circuits.

7. The high-frequency transistor of claim 1, further comprising:
    a plurality of gate electrodes, each of which is the gate electrode;
    a plurality of impedance adjustment circuits, each of which is the impedance adjustment circuit; and
    a gate bus line that transmits a signal to the gate drive line, wherein
    the plurality of gate electrodes are spaced apart from each other and arranged in a straight line, and
    ones of ends of the plurality of gate electrodes, which are closer to the gate bus line, are connected to the gate drive line via the respective impedance adjustment circuits.

8. The high-frequency transistor of claim 1, further comprising:
    a ground conductive film on one of two principal surfaces of the semiconductor substrate, which is opposite to an other one of the two principal surfaces provided with the impedance adjustment circuit; and
    a source potential layer with a same potential as the source electrode, wherein
    the source potential layer is formed above both of the gate electrode and the impedance adjustment circuit.

9. The high-frequency transistor according to claim 8, wherein
    the impedance adjustment circuit includes a stripline, and
    $0.5 \leq W/H \leq 50$ is satisfied, where W denotes a width of the stripline and H denotes a distance between the stripline and the source potential layer.

10. The high-frequency transistor according to claim 1, further comprising:
    a ground conductive film on one of two principal surfaces of the semiconductor substrate, which is opposite to the one provided with the impedance adjustment circuit, wherein
    no source potential layer with a same potential as a potential of the source electrode is above the gate electrode or the impedance adjustment circuit.

11. The high-frequency transistor according to claim 10, wherein
    the impedance adjustment circuit includes a microstripline, and
    $0.025 \leq W/H \leq 1.2$ is satisfied, where W denotes a width of the microstripline and H denotes a distance between the microstripline and a source potential layer.

* * * * *